(12) United States Patent
Woody et al.

(10) Patent No.: US 7,916,480 B2
(45) Date of Patent: Mar. 29, 2011

(54) BUSBAR ASSEMBLY WITH INTEGRATED COOLING

(75) Inventors: George R. Woody, Redondo Beach, CA (US); Terence G. Ward, Redondo Beach, CA (US)

(73) Assignee: GM Global Technology Operations LLC, Detroit, MI (US)

( * ) Notice: Subject to any disclaimer, the term of this patent is extended or adjusted under 35 U.S.C. 154(b) by 125 days.

(21) Appl. No.: 12/336,800

(22) Filed: Dec. 17, 2008

(65) Prior Publication Data

US 2009/0161301 A1 Jun. 25, 2009

Related U.S. Application Data

(60) Provisional application No. 61/015,002, filed on Dec. 19, 2007.

(51) Int. Cl.
*H05K 7/20* (2006.01)

(52) U.S. Cl. .......................... 361/699; 361/775

(58) Field of Classification Search .................. 361/775
See application file for complete search history.

(56) References Cited

U.S. PATENT DOCUMENTS

| | | | | |
|---|---|---|---|---|
| 3,007,088 | A | * | 10/1961 | Diebold .......................... 257/718 |
| 4,894,709 | A | * | 1/1990 | Phillips et al. ................. 257/714 |
| 4,956,746 | A | * | 9/1990 | Gates et al. .................... 361/699 |
| 5,111,280 | A | * | 5/1992 | Iversen .......................... 257/713 |
| 5,214,564 | A | * | 5/1993 | Metzler et al. ................. 361/699 |
| 5,579,217 | A | * | 11/1996 | Deam et al. .................... 363/144 |
| 5,655,290 | A | * | 8/1997 | Moresco et al. ................ 29/830 |
| 5,804,761 | A | * | 9/1998 | Donegan et al. ............... 174/15.1 |
| 5,940,263 | A | * | 8/1999 | Jakoubovitch ................. 361/328 |
| 6,574,094 | B1 | * | 6/2003 | Morrow et al. ................. 361/676 |

FOREIGN PATENT DOCUMENTS

| | | |
|---|---|---|
| CN | 1208960 A | 2/1999 |
| WO | 2007028039 A2 | 3/2007 |

* cited by examiner

*Primary Examiner* — Gregory D Thompson
(74) *Attorney, Agent, or Firm* — Ingrassia Fisher & Lorenz, P.C.

(57) ABSTRACT

A busbar assembly is configured such that the power devices (e.g., IGBT die) and diodes are directly mounted to the busbars. The busbars act as heat sinks, and may be cooled using micro channels, micropin fins, direct cooling, or any other heat transfer method. One assembly includes a plurality of busbars, a plurality of power semiconductor devices bonded to the plurality of busbars, and an integrated cooling system within one or more of the busbars.

10 Claims, 3 Drawing Sheets

Section A-A

BUSBAR ASSEMBLY WITH INTEGRATED COOLING

CROSS-REFERENCE

This application claims priority to U.S. Provisional Pat. Ser. No. 61/015,002 filed Dec. 19, 2007.

TECHNICAL FIELD

The present invention generally relates to semiconductor devices, and more particularly relates to power semiconductor components that incorporate one or more busbars.

BACKGROUND

High-end motor systems such as those used in hybrid vehicles are often controlled using one or more high power modules. A traction drive system, for example, consists of a motor, a gearbox, a drive unit, and an inverter for controlling the motor. The inverter and drive unit are typically located in separate chassis.

The inverter generally includes an IGBT (Insulated Gate Bipolar Transistor) and a large silicon diode. These power components are mounted (e.g., soldered) on DBC (Direct Bond Copper) substrates, which comprise copper layers with an insulating ceramic layer sandwiched in between. Wire bonds or other interconnects are used to provide electrical connectivity between a busbar (typically a thick bar of copper) and the various die, where the busbar provides electrical communication with external systems.

It is desirable to reduce the complexity of such electronic components while improving their heat transfer characteristics. Typically, known busbar assemblies typically utilize large heat sinks or air-cooled units, thus resulting in additional components, increased cost, and additional required space.

Accordingly, there is a need for improved heat transfer methods in power devices such as those used in connection with motor control inverters. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description. The invention may be described herein in terms of functional and/or logical block components and various processing steps. It should be appreciated that such block components may be realized by any number of hardware, software, and/or firmware components configured to perform the specified functions. For the purposes of conciseness, conventional techniques and systems related to semiconductor processing, transistor theory, packaging, and power modules are not described in detail herein.

In general, the present invention relates to a power device integrated with a busbar used for heat dissipation, thereby reducing the cost, mass, and volume of the resulting power component.

As mentioned above, an inverter used in connection with a motor typically includes one or more IGBTs (Insulated Gate Bipolar Transistors) coupled to corresponding diodes (e.g., silicon diodes). These components are typically mounted (e.g., soldered) on DBC (Direct Bond Copper) substrates, where the opposite side of the DBC acts as the interface to a heat sink. The die and diode side are interconnected (via wires or the like) to the bus bar connections.

In accordance with the present invention, however, the power die itself (e.g., an IGBT die) and diode are directly mounted to the busbars, and the two components are suitably connected. The busbars act as heat sinks, and may themselves be cooled using micro channels, micropin fins, direct cooling, or any other heat transfer method, as will be shown in greater detail below. The invention can also be used with other devices other than IGBT's such as WBG (Wide Band Gap) devices such as VJFET (Vertical Junction Field Effect Transistors) made from silicon carbide (SiC) or gallium nitride (GaN) for example.

Figure 1:
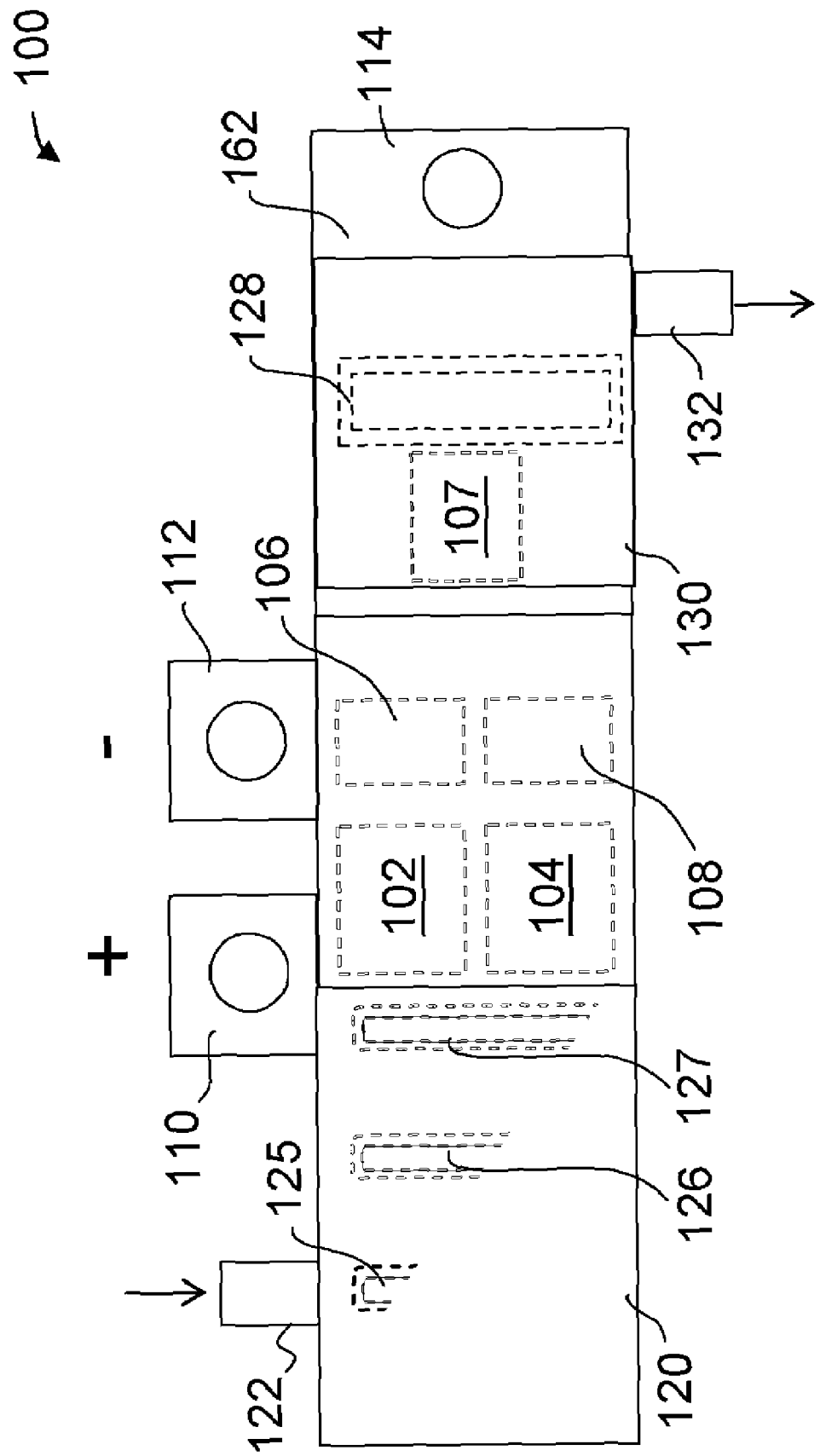
FIG. 1 is a simplified overview of a busbar assembly in accordance with one embodiment of the present invention.

FIG. 1 is a simplified plan view of an exemplary busbar assembly 100 in accordance with one embodiment of the invention. As shown, assembly 100 includes a plurality of busbars having a positive terminal 110 and a negative terminal 112 each protruding outward and configured to electrically communicate with external components in the traditional manner. Similarly, busbar 162 has an output node 114 configured for electrical coupling to an AC device such as a drive motor.

Two manifolds, 120 and 130, are coupled to opposite ends of assembly 100. Manifold 120 is in fluid communication with an inlet 122, and manifold 130 is in fluid communication with manifold 130. Manifold 120 is configured to receive coolant from a pressurized stream, and manifold 130 is in fluid communication with, for example, a downstream heat exchanger configured to remove heat from effluent coolant.

Various semiconductor die components, such as IGBTs 102 and 104, diodes 106 and 108, gate drivers 105 and 107 are directly connected to the various busbars as described in further detail below.

During operation, the busbars transfer signals received from the positive and negative nodes 110 and 112 of a DC source to each power diode and/or IGBT device connected thereto, thereby generating a single-phase AC signal that is transferred through busbar 162 to, for example, a vehicular AC system. Busbar assembly 100 is actively cooled by a coolant that flows from first manifold 120, through coolant channels (illustrated below) of at least one busbar, and exits through second manifold 130 where it may flow to a heat exchanger for cooling and recycling to busbar assembly 100. As shown in partial cutaway, various ports—e.g., ports 125, 126, 127, and 128—are formed in the busbars to facilitate the transfer of fluid therethrough.

Figure 2:
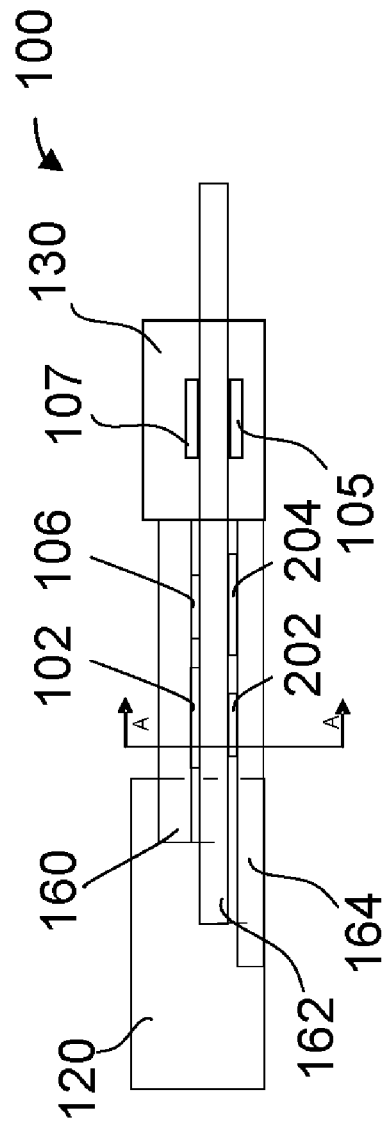
FIG. 2 is a cross-sectional view of section A-A of the busbar assembly of FIG. 1.

More particularly, referring to FIG. 2, busbar assembly 120 includes a positive DC busbar 160, a negative DC busbar 164, an AC busbar 162, and any number of power devices such as IGBTs and/or power diodes (102, 106, 202, and 204). In the illustrated embodiment, DC busbar 160 is coupled to a first IGBT 102 and a first power diode 106 mounted thereon, and is coupled to the positive node of a DC source such as a battery or fuel cell (not shown). Similarly, negative DC busbar 164 is coupled to a second IGBT 204 and a second power diode 202, and is coupled to the negative node of a DC source (not shown). Each of these power devices has a first side directly mounted to a respective busbar surface using solder or the like in any conventional manner.

Electrical connection between power devices and AC busbar 162 is made using wire bonding or the like. During operation, these power devices in combination transform DC signals received through positive and negative busbars 160 and 164 to a single-phase AC output signal transferred through AC busbar 162 to an AC system such as a drive motor.

In one embodiment, each busbar 160, 162, and 164 is composed of copper or a copper alloy, and is electrically interconnected with an adjacent busbar only through the power devices described above. All or part of each busbar may be plated—e.g., via tin plating known in the art.

An insulating material such as an epoxy may be injected into the gaps 163 between busbars 160, 162, and 164 to encapsulate the power devices and provide electrical and environmental isolation.

Figure 3:
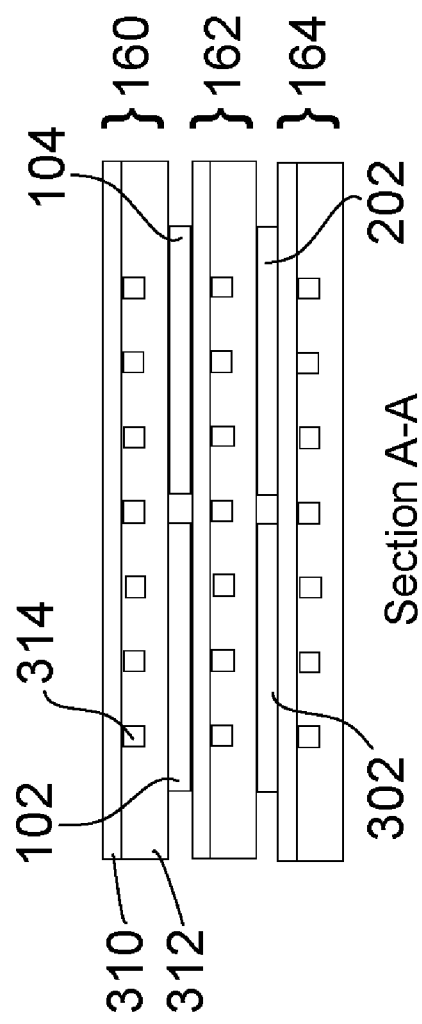
FIG. 3 is a cross-sectional view of a particular section designated in FIG. 2.

FIG. 3 is a cross-sectional view of busbar assembly 100 taken along section A-A in FIG. 2. As shown, busbar assembly 100 includes DC busbars 160 and 164 arranged in a single stack with busbar 162 interposed therebetween. IGBT power die 102, 202, 104, and 302 are mounted therebetween to achieve the desired electrical functionality. Mounting of semiconductor devices to busbars may be done by soldering or the like in any conventional manner.

In one embodiment, at least one of busbars 160, 162, and/or 164 has a plurality of continuous channels through which a dielectric coolant liquid may flow, each channel having a first end and a second end in fluid communication with first and second manifolds 120 and 130 (FIG. 2), respectively. Channels may be formed integrally into each busbar, or may be formed by bonding a sealing plate to a body having a plurality of grooves formed in a surface. For example, as shown in FIG. 3, DC busbar 160 may include sealing plates 310 placed on an upper surface of body 312 and bonded thereto (using solder for example) forming a first plurality of channels 314. In either case, channels 314 each have an inlet and an outlet in fluid communication with first manifold 120 and second manifold 130 (FIG. 2), respectively.

First manifold 120 provides a supply of pressurized coolant that flows through the channels 314 of each busbar to provide cooling thereto. Coolant flowing through the channels absorbs heat generated within busbar assembly 100 and exits into second manifold 130 in a heated state where it may be directed to a downstream heat exchanger for cooling and subsequent recycling back to first manifold 120.

Accordingly, the present busbar assembly eliminates many of the typical IGBT interface elements. The compact, vertically stacked configuration of this assembly can be used to make a smaller PEB or inverter chassis for maximum integration in a motor. Device mounting to various busbars is preferably done in a manner to reduce stray inductance to a minimum, which helps with high switching frequencies and reduced ripple. This in turn helps to reduce size of other components such as capacitors and inductors.

Figure 4:
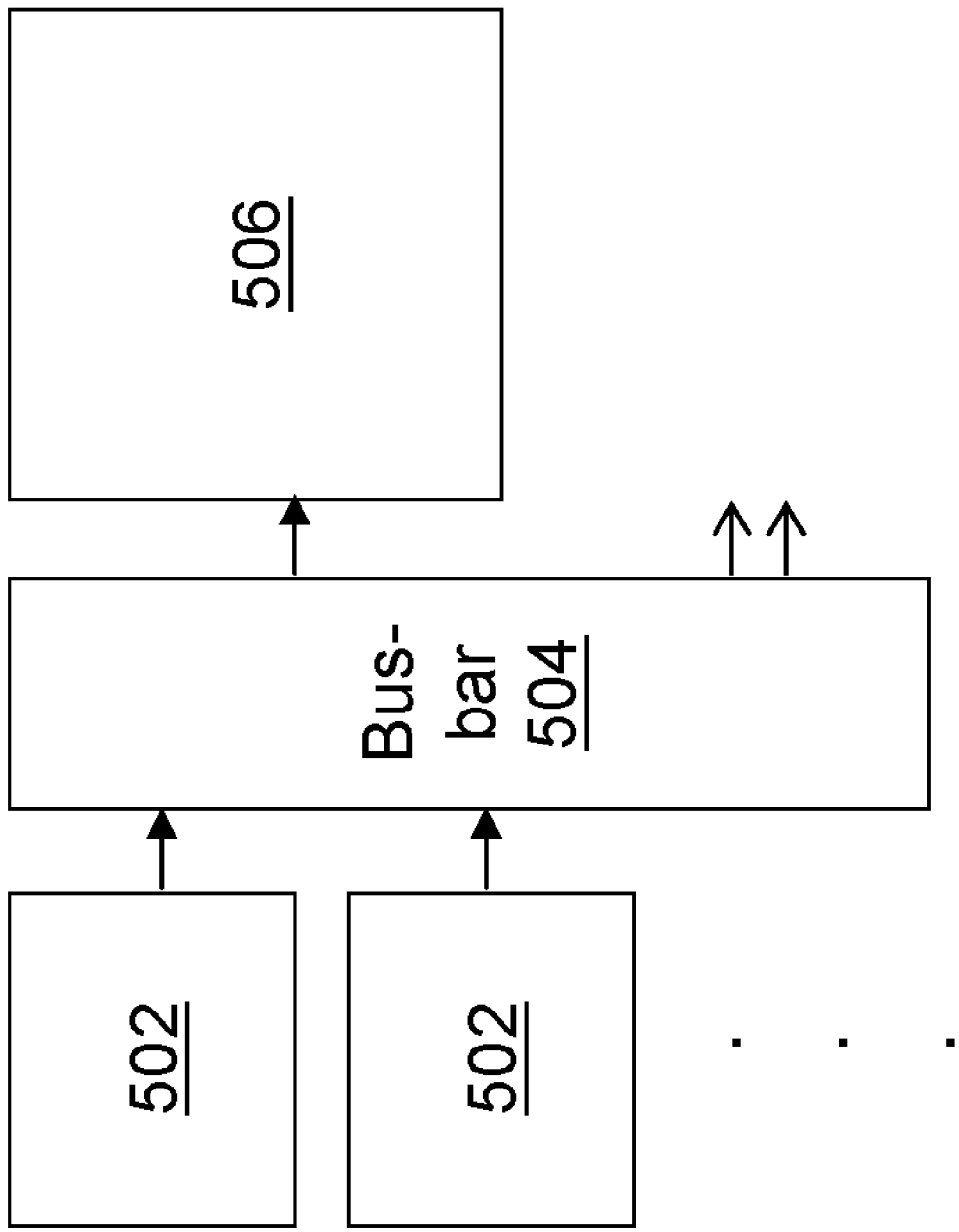
FIG. 4 is a conceptual heat-transfer diagram associated with the present invention.

In general, a number of integrated cooling systems may be used in accordance with the present invention. FIG. 4 is a conceptual block diagram depicting heat flow in the system. As shown, heat from power dice 502 is conducted to busbar 504. The heat transferred to busbar 504 is then suitably dissipated to the environment in any convenient manner—e.g., via conduction, convection (forced or free), and/or radiation. In one embodiment, for example, a thermal subsystem 506 is used to increase heat dissipation. Such a subsystem 506 may include direct cooling, micropin fins, micro channels, phase-change, or any other heat transfer system now known or later developed.

The illustrated embodiments allow for highly integrated power switching devices in, for example, the several kW region. The typical traction motor may run at 100 kW of power, and thus requires high performance cooling. This invention can also be used with choppers for converters as well as multi-phase inverters, such as six-phase inverters.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention and the legal equivalents thereof.

What is claimed is:

1. A busbar assembly comprising:
   a plurality of mechanically and electrically interconnected busbars; and
   a plurality of power semiconductor die directly bonded to a substantially planar mounting area provided on each of the plurality of busbars, wherein at least one of the busbars includes an integrated cooling system having one or more channels configured to accept a coolant flowing therethrough; and
   a first header having an inlet for the coolant, and a second header having an outlet for the coolant, wherein the first and second headers are in fluid communication with the integrated cooling system;
   wherein the plurality of busbars includes a first DC busbar, a second DC busbar, and a AC busbar provided therebetween.

2. The busbar assembly of claim 1, wherein the one or more channels of the integrated cooling system are microchannels.

3. The busbar assembly of claim 1, wherein the plurality of power semiconductor includes at least one IGBT device and at least one diode electrically coupled thereto.

4. The busbar assembly of claim 1, further comprising polymeric insulating layers between the plurality of power semiconductor.

5. The busbar assembly of claim 1, wherein the outlet is coupled to a stator of a motor.

6. A vehicular inverter module comprising:
   a plurality of mechanically and electrically interconnected busbars; and
   a plurality of power semiconductor die directly bonded to the plurality of busbars, the plurality of power semiconductor die including pairs of IGBT devices and power diodes connected in an inverter configuration, wherein at least one of the busbars includes an integrated cooling system including one or more channels configured to accept a coolant flowing therethrough; and a header mechanically coupled to the plurality of busbars and in fluid communication with the integrated cooling system;

wherein the plurality of busbars includes a first DC busbar, a second DC busbar, and a AC busbar provided therebetween.

7. The vehicular inverter module of claim 6, wherein the one or more channels of the integrated cooling system are includes one or more microchannels.

8. The vehicular inverter module of claim 6, further comprising polymeric insulating layers between the plurality of power semiconductor die.

9. A method of cooling an inverter module having a plurality of power semiconductor devices mounted therein, the method comprising:

providing a plurality of busbars having channels formed therein, wherein the plurality of busbars are mechanically and electrically interconnected;

mounting the power semiconductor devices directly to the plurality of busbars;

coupling a fluid inlet and a fluid outlet to the channels of the plurality of busbars;

cycling a cooling fluid through the inlet and the outlet of the plurality of busbars such that heat generated by the power semiconductor devices is transferred thereto;

wherein the plurality of busbars includes a first DC busbar, a second DC busbar, and a AC busbar provided therebetween.

10. The method of claim 9, wherein the channels include one or more microchannels.

* * * * *